(12) United States Patent
Imai et al.

(10) Patent No.: US 11,333,731 B2
(45) Date of Patent: May 17, 2022

(54) MAGNETIC RESONANCE IMAGING APPARATUS, RF COIL, AND MAGNETIC RESONANCE IMAGING METHOD

(71) Applicant: CANON MEDICAL SYSTEMS CORPORATION, Otawara (JP)

(72) Inventors: Satoshi Imai, Nasushiobara (JP); Sadanori Tomiha, Nasushiobara (JP)

(73) Assignee: CANON MEDICAL SYSTEMS CORPORATION, Otawara (JP)

(*) Notice: Subject to any disclaimer, the term of this patent is extended or adjusted under 35 U.S.C. 154(b) by 291 days.

(21) Appl. No.: 16/381,451

(22) Filed: Apr. 11, 2019

(65) Prior Publication Data

US 2019/0317166 A1    Oct. 17, 2019

(30) Foreign Application Priority Data

Apr. 13, 2018   (JP) .............................. JP2018-077462
Apr. 9, 2019    (JP) .............................. JP2019-074087

(51) Int. Cl.
| | |
|---|---|
| *G01R 33/48* | (2006.01) |
| *G01R 33/34* | (2006.01) |
| *G01R 33/24* | (2006.01) |
| *G01R 33/36* | (2006.01) |
| *G01R 33/56* | (2006.01) |
| *G01R 33/561* | (2006.01) |

(52) U.S. Cl.
CPC ....... *G01R 33/4818* (2013.01); *G01R 33/246* (2013.01); *G01R 33/34046* (2013.01); *G01R 33/34076* (2013.01); *G01R 33/3614* (2013.01); *G01R 33/56* (2013.01); *G01R 33/5611* (2013.01)

(58) Field of Classification Search
CPC .............. G01R 33/4818; G01R 33/246; G01R 33/34046; G01R 33/3614; G01R 33/56; G01R 33/561; G01R 33/5611
USPC ......................................................... 324/311
See application file for complete search history.

(56) References Cited

U.S. PATENT DOCUMENTS

| | | | | |
|---|---|---|---|---|
| 7,427,861 | B2* | 9/2008 | Bogdanov | ........ G01R 33/34046 |
| | | | | 324/318 |
| 10,107,882 | B2* | 10/2018 | de Weerdt | .......... G01R 33/5611 |

(Continued)

FOREIGN PATENT DOCUMENTS

| | | |
|---|---|---|
| JP | 2005-523094 | 8/2005 |
| JP | 2005-270674 | 10/2005 |

(Continued)

*Primary Examiner* — Judy Nguyen
*Assistant Examiner* — Rahul Maini
(74) *Attorney, Agent, or Firm* — Oblon, McClelland, Maier & Neustadt, L.L.P.

(57) ABSTRACT

An MRI apparatus according to an embodiment includes a whole body RF coil accommodated in a gantry. The whole body RF coil includes a first element unit used for transmission of a radio frequency magnetic field; and a second element unit used for reception of a magnetic resonance signal produced from a subject having been applied with the radio frequency magnetic field. The first element unit is a birdcage-type RF coil having two end rings and a plurality of rungs spaced apart from each other along the circumferential direction of the end rings. The second element unit is a microstrip antenna.

18 Claims, 7 Drawing Sheets

(56) References Cited

U.S. PATENT DOCUMENTS

| | | | | |
|---|---|---|---|---|
| 2002/0079996 A1* | 6/2002 | Zhang | ................ | G01R 33/345 335/216 |
| 2002/0097050 A1* | 7/2002 | Kellman | ............ | G01R 33/5611 324/309 |
| 2003/0071621 A1* | 4/2003 | Watkins | ........... | G01R 33/34046 324/318 |
| 2007/0229076 A1 | 10/2007 | Habara et al. | | |
| 2008/0157769 A1* | 7/2008 | Renz | ................ | G01R 33/3692 324/318 |
| 2010/0213941 A1* | 8/2010 | Driesel | ............. | G01R 33/3415 324/322 |
| 2010/0253350 A1* | 10/2010 | Huish | ................ | G01R 33/3692 324/318 |

FOREIGN PATENT DOCUMENTS

| | | |
|---|---|---|
| JP | 2007-275164 | 10/2007 |
| WO | WO 02/031522 A1 | 4/2002 |
| WO | WO 03/089947 A1 | 10/2003 |

* cited by examiner

MAGNETIC RESONANCE IMAGING APPARATUS, RF COIL, AND MAGNETIC RESONANCE IMAGING METHOD

CROSS-REFERENCE TO RELATED APPLICATIONS

This application is based upon and claims the benefit of priority from Japanese Patent Application No. 2018-077462, filed on Apr. 13, 2018 and Japanese Patent Application No. 2019-074087, filed on Apr. 9, 2019; the entire contents of which are incorporated herein by reference.

FIELD

Embodiments relate to a magnetic resonance imaging apparatus, an RF coil, and a magnetic resonance imaging method.

BACKGROUND

Conventionally, a magnetic resonance imaging (MRI) apparatus applies a radio frequency magnetic field to a subject placed in a static magnetic field and generates an image in the subject based on a magnetic resonance signal produced from the subject by the effect of the radio frequency magnetic field.

Parallel imaging is known as a technique for reducing an imaging time in such a magnetic resonance imaging apparatus. The parallel imaging is an imaging method using an array coil having a plurality of coil elements and uses the sensitivity distribution of each coil element included in the array coil to accelerate imaging.

DETAILED DESCRIPTION

An MRI apparatus according to an embodiment includes a whole body RF coil accommodated in a gantry. The whole body RF coil includes a first element unit used for transmission of a radio frequency magnetic field; and a second element unit used for reception of a magnetic resonance signal produced from a subject having been applied with the radio frequency magnetic field. The first element unit is a birdcage-type RF coil having two end rings and a plurality of rungs spaced apart from each other along the circumferential direction of the end rings. The second element unit is a microstrip antenna.

Embodiments of an MRI apparatus, an RF coil, and an MRI method will be described in detail below with reference to the drawings.

First Embodiment

Figure 1:
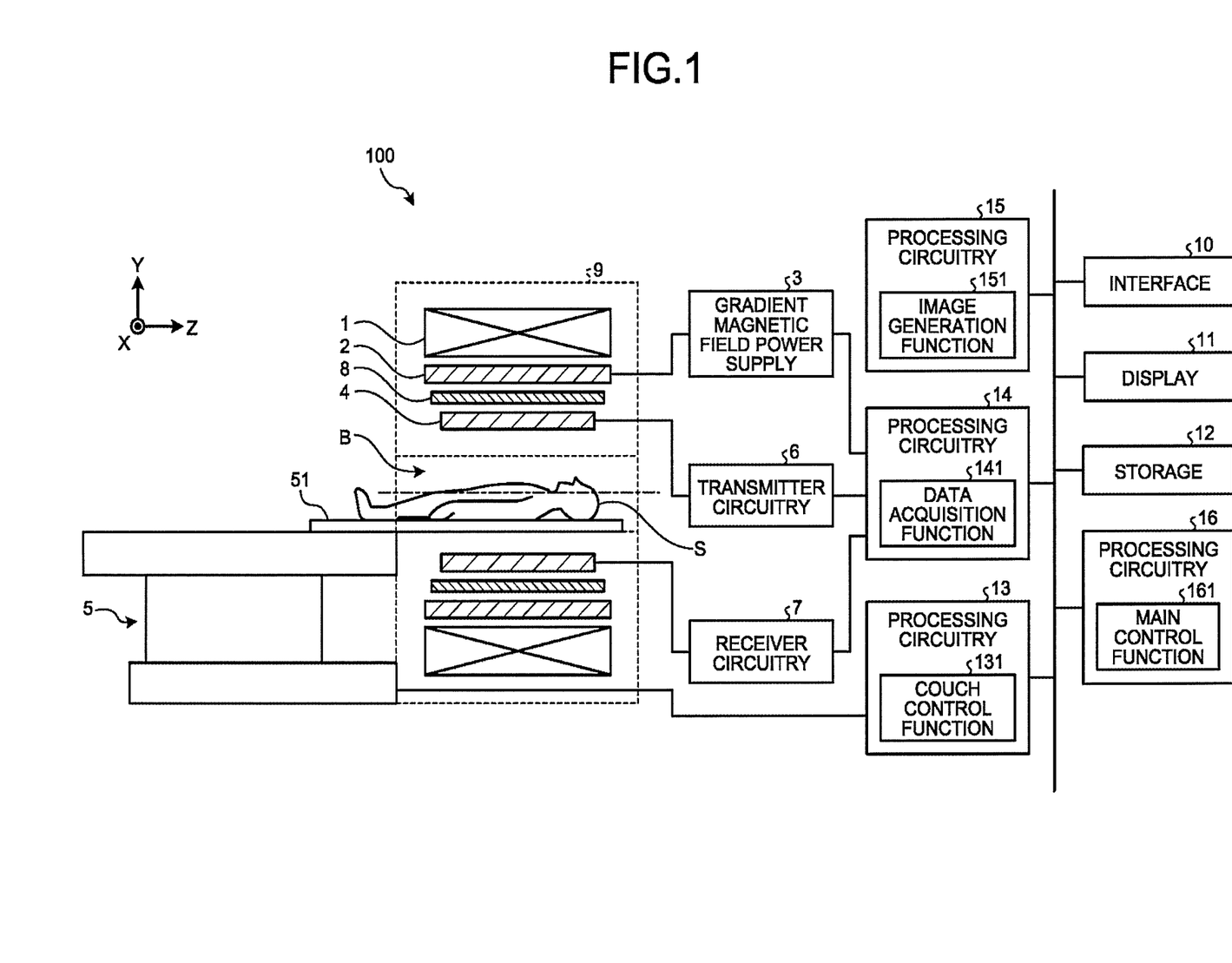
FIG. 1 is a diagram illustrating a configuration example of an MRI apparatus according to the present embodiment.

FIG. 1 is a diagram illustrating a configuration example of an MRI apparatus according to a first embodiment.

For example, as illustrated in FIG. 1, an MRI apparatus 100 according to the present embodiment includes a magnet 1, a gradient coil 2, a gradient magnetic field power supply 3, a whole body (WB) coil 4, a couch 5, transmitter circuitry 6, receiver circuitry 7, a radio frequency (RF) shield 8, a gantry 9, an interface 10, a display 11, a storage 12, and processing circuitries 13 to 16.

The magnet 1 produces a static magnetic field in an imaging space in which a subject S is disposed. Specifically, the magnet 1 is formed in a substantially hollow cylindrical shape (including the one having an oval shape in cross section orthogonal to the center axis of the cylinder) and produces a static magnetic field in an imaging space disposed in the cylinder. For example, the magnet 1 has a cooling container formed in a substantially cylindrical shape and a magnet such as a superconducting magnet immersed in a coolant (for example, liquid helium) filling the cooling container. Here, for example, the magnet 1 may produce a static magnetic field using a permanent magnet.

The gradient coil 2 is disposed inside the magnet 1 and produces a gradient magnetic field along a plurality of axial directions in the imaging space in which the subject S is disposed. Specifically, the gradient coil 2 is formed in a substantially hollow cylindrical shape (including the one having an oval shape in cross section orthogonal to the center axis of the cylinder) and produces a gradient magnetic field along the axial direction of each of the X-axis, the Y-axis, and the Z-axis orthogonal to each other in the imaging space disposed in the cylinder. Here, the X-axis, the Y-axis, and the Z-axis constitute an apparatus coordinate system unique to the MRI apparatus 100. For example, the Z-axis is coincident with the axis of the cylinder of the gradient coil 2 and is set along the magnetic flux of the static magnetic field produced by the magnet 1. The X-axis is set along the horizontal direction orthogonal to the Z-axis, and the Y-axis is set along the vertical direction orthogonal to the Z-axis and the X-axis.

The gradient magnetic field power supply 3 supplies current to the gradient coil 2 to produce a gradient magnetic field along the axial direction of each of the X-axis, the Y-axis, and the Z-axis in the internal space of the gradient coil 2. In this way, the gradient magnetic field power supply 3 produces a gradient magnetic field along the axial direction of each of the X-axis, the Y-axis, and the Z-axis to produce gradient magnetic fields along a readout direction, a phase encode direction, and a slice direction. Here, the axes along the readout direction, the phase encode direction, and the slice direction constitute a logic coordinate system for defining a slice region or volume region to be imaged. Hereinafter, the gradient magnetic field along the readout direction is called readout gradient magnetic field, the gradient magnetic field along the phase encode direction is called phase encode gradient magnetic field, and the gradient magnetic field along the slice direction is called slice gradient magnetic field.

Each of the readout gradient magnetic field, the phase encode gradient magnetic field, and the slice gradient magnetic field is superimposed on a static magnetic field produced by the magnet 1 to add spatial position information to a magnetic resonance (MR) signal produced from the subject S. The readout gradient magnetic field changes the frequency of the MR signal according to the position in the readout direction to add position information along the readout direction to the MR signal. The phase encode gradient magnetic field changes the phase of the MR signal along the phase encode direction to add position information in the phase encode direction to the MR signal. The slice gradient magnetic field adds position information along the slice direction to the MR signal. For example, when the imaging region is a slice region, the slice gradient magnetic field is used for determining the direction, the thickness, and the number of slice regions. When the imaging region is a volume region, the slice gradient magnetic field is used for changing the phase of the MR signal according to the position in the slice direction.

The WB coil 4 is a whole body RF coil disposed inside the gradient coil 2 and having a function of a transmitter coil to apply an RF magnetic field to the imaging space in which the subject S is disposed and a function of a receiver coil to receive an MR signal produced from the subject S by the effect of the RF magnetic field. Specifically, the WB coil 4 is formed in a substantially hollow cylindrical shape (including the one having an oval shape in cross section orthogonal to the center axis of the cylinder) and applies an RF magnetic field to the imaging space disposed in the cylinder, based on an RF pulse signal supplied from the transmitter circuitry 6. The WB coil 4 receives an MR signal produced from the subject S by the effect of the RF magnetic field and outputs the received MR signal to the receiver circuitry 7.

The couch 5 includes a couchtop 51 on which the subject S lies, and the couchtop 51 with the subject S is moved to the imaging space when the subject S is imaged. For example, the couch 5 is installed such that its longitudinal direction is parallel to the center axis of the magnet 1.

The transmitter circuitry 6 outputs an RF pulse signal corresponding to the Larmor frequency unique to target atomic nucleuses placed in the static magnetic field, to the WB coil 4. Specifically, the transmitter circuitry 6 has a pulse generator, an RF generator, a modulator, and an RF amplifier. The pulse generator generates a waveform of an RF pulse signal. The RF generator produces an RF signal with resonance frequency. The modulator modulates the amplitude of the RF signal produced by the RF generator with the waveform produced by the pulse generator to generate an RF pulse signal. The RF amplifier amplifies the RF pulse signal produced by the modulator and outputs the amplified RF pulse signal to the WB coil 4.

The receiver circuitry 7 generates MR signal data based on the MR signal received by the WB coil 4 and outputs the generated MR signal data to the processing circuitry 14. Specifically, the receiver circuitry 7 includes a preamplifier, a detector, and an analog-to-digital (A/D) converter. The preamplifier amplifies the MR signal output from the WB coil 4. The detector detects an analog signal obtained by subtracting a resonance frequency component from the MR signal amplified by the preamplifier. The A/D converter converts the analog signal detected by the detector into a digital signal to generate MR signal data and outputs the generated MR signal data to the processing circuitry 14.

The RF shield 8 is disposed between the gradient coil 2 and the WB coil 4 to shield the gradient coil 2 from the RF magnetic field produced by the WB coil 4. Specifically, the RF shield 8 is formed in a substantially hollow cylindrical shape (including the one having an oval shape in cross section orthogonal to the center axis of the cylinder) and is disposed in a space on the inner peripheral side of the gradient coil 2 to cover the outer peripheral surface of the WB coil 4.

The gantry 9 accommodates the magnet 1, the gradient coil 2, the WB coil 4, and the RF shield 8. Specifically, the gantry 9 has an open bore B formed in a cylindrical shape and accommodates the magnet 1, the gradient coil 2, the WB coil 4, and the RF shield 8 disposed therein so as to surround the bore B. Here, the interior space of the bore B in the gantry 9 serves as the imaging space in which the subject S is disposed when the subject S is imaged.

Here, the MRI apparatus 100 has a tunnel-type construction in which the magnet 1, the gradient coil 2, and the WB coil 4 are each formed in a substantially cylindrical shape, but embodiments are not limited thereto. For example, the MRI apparatus 100 may have an open-type construction in which a pair of magnets, a pair of gradient coils, and a pair of RF coils are disposed to face each other across an imaging space in which a subject S is disposed.

The interface 10 accepts input operation of a variety of instructions and a variety of information from the operator. Specifically, the interface 10 is connected to the processing circuitry 16 and converts input operation received from the operator into an electrical signal, which is in turn output to the processing circuitry 16. For example, the interface 10 is implemented by, for example, a trackball, a switch button, a mouse, a keyboard, a touchpad having an operation surface touched for input operation, a touchscreen including a display screen integrated with a touchpad, a contactless input circuit using an optical sensor, and a sound input circuit for setting imaging conditions and a region of interest (ROI). In the present specification, the interface 10 is not limited to the one only including physical operation parts such as a mouse and a keyboard. For example, an electrical signal processing circuitry that receives an electrical signal corresponding to input operation from an external input device provided separate from the apparatus and outputs this electrical signal to a control circuit is also included in examples of the interface 10.

The display 11 displays a variety of information and a variety of images. Specifically, the display 11 is connected to the processing circuitry 16, converts data of information and images sent from the processing circuitry 16 into an electrical signal for display, and outputs the converted electrical signal. For example, the display 11 is implemented by, for example, a liquid crystal monitor, a cathode ray tube (CRT) monitor, and a touch panel.

The storage 12 stores a variety of data. Specifically, the storage 12 stores MR signal data and image data. For example, the storage 12 is implemented by, for example, a semiconductor memory device such as a random access memory (RAM) and a flash memory, a hard disk, and an optical disk.

The processing circuitry 13 has a couch control function 131. The couch control function 131 outputs a control electrical signal to the couch 5 to control the operation of the couch 5. For example, the couch control function 131 accepts an instruction to move the couchtop 51 in the longitudinal direction, in the up/down direction, or in the right/left direction from the operator through the interface 10 and operates a mechanism moving the couchtop 51 of the couch 5 to move the couchtop 51 in accordance with the accepted instruction.

The processing circuitry 14 has a data acquisition function 141. The data acquisition function 141 drives the gradient magnetic field power supply 3, the transmitter circuitry 6, and the receiver circuitry 7 to acquire MR signal data of the subject S. Specifically, the data acquisition function 141 executes a variety of pulse sequences based on sequence execution data output from the processing circuitry 16 to acquire MR signal data. Here, the sequence execution data is information that defines, for example, the timing for the gradient magnetic field power supply 3 to supply current to the gradient coil 2, the intensity of current to be supplied, the intensity and the supply timing of an RF pulse signal supplied by the transmitter circuitry 6 to the WB coil 4, and a detection timing for the receiver circuitry 7 to detect an MR signal. The data acquisition function 141 then receives MR signal data from the receiver circuitry 7 as a result of execution of a variety of pulse sequences and stores the received MR signal data into the storage 12. A set of MR signal data received by the data acquisition function 141 is arranged in two dimensions or three dimensions in accordance with the above-noted position information added by the readout gradient magnetic field, the phase encode gradient magnetic field, and the slice gradient magnetic field, and stored as data constituting k-space in the storage 12.

The processing circuitry 15 has an image generation function 151. The image generation function 151 generates an image based on MR signal data stored in the storage 12. Specifically, the image generation function 151 reads MR signal data stored by the data acquisition function 141 in the storage 12 and performs post-processing, that is, a reconstruction process such as Fourier transform on the read MR signal data to generate an image. The image generation function 151 stores image data of the generated image into the storage 12.

The processing circuitry 16 has a main control function 161. The main control function 161 controls each component of the MRI apparatus 100 to control the entire MRI apparatus 100. Specifically, the main control function 161 displays a graphical user interface (GUI) for accepting input operation of a variety of instructions and a variety of information from the operator on the display 11. The main control function 161 then controls each component of the MRI apparatus 100 in accordance with the input operation accepted through the interface 10. For example, the main control function 161 accepts input of imaging conditions from the operator through the interface 10. The main control function 161 then generates sequence execution data based on the accepted imaging conditions and transmits the sequence execution data to the processing circuitry 14 to execute a variety of pulse sequences. For example, the main control function 161 reads image data from the storage 12 in response to a request from the operator and outputs the read image data to the display 11.

Here, the processing circuitries 13 to 16 described above are implemented, for example, by a processor. In this case, the processing function of each processing circuitry is, for example, stored in the form of a program executable by a computer in the storage 12. Each processing circuitry reads the corresponding program from the storage 12 to implement the function corresponding to the program. Here, the processing circuitries may be configured with a plurality of processors and each processor may execute a program to implement the processing function. The processing functions of the processing circuitries may be implemented so as to be distributed or integrated as appropriate on a single or a plurality of processing circuitries. Here, a single storage 12 stores a program corresponding to each processing function. However, a plurality of storages may be arranged in a distributed manner and the processing circuitry may read a corresponding program from each individual storage.

An overall configuration of the MRI apparatus 100 according to the present embodiment has been described above. Based on such a configuration, the MRI apparatus 100 according to the present embodiment has the function of performing parallel imaging.

In general, in an MRI apparatus, imaging is performed by attaching an array coil having a plurality of coil elements to a patient (subject). However, setting the array coil tends to be complicated and takes time or gives the patient discomfort because the array coil is in intimate contact with the body. When only the birdcage-type WB coil contained in the MRI apparatus is used, this problem does not arise, but parallel imaging is unable to be performed. By contrast, for example, if a plurality of coil elements are disposed for parallel imaging, an RF magnetic field is transmitted for each coil element, and the uniformity of RF magnetic field cannot be ensured. In order to handle both, for example, a coil element disposed so as to produce a uniform RF magnetic field and a coil element for parallel imaging may be used in combination. However, if coil elements are merely arranged, it is difficult to perform decoupling between the elements.

In view of the situation above, the MRI apparatus 100 according to the present embodiment is configured to be able to perform parallel imaging while ensuring the uniformity of RF magnetic field without using an array coil.

Specifically, in the present embodiment, the WB coil 4 includes a first element unit for transmission or for transmission/reception and a plurality of second element units for reception or for transmission/reception. Here, in the present embodiment, the first element unit is a birdcage-type RF coil having two end rings and a plurality of rungs spaced apart from each other along the circumferential direction of the end rings. The second element units are a plurality of microstrip antennas (also called microstrip patch antennas, patch antennas) each configured with part of the first element unit as a ground conductor.

More specifically, the WB coil 4 according to the present embodiment is an RF coil that combines a birdcage-type RF coil and a plurality of microstrip antennas. In such a WB coil 4, in transmission, the birdcage-type RF coil is used to keep the uniformity of RF magnetic field, while in reception, a plurality of microstrip antennas are used to enable parallel imaging. Accordingly, the present embodiment enables parallel imaging while ensuring the uniformity of RF magnetic field without using an array coil.

The configuration of the MRI apparatus 100 according to the present embodiment described above will be described in detail below.

Figure 2:
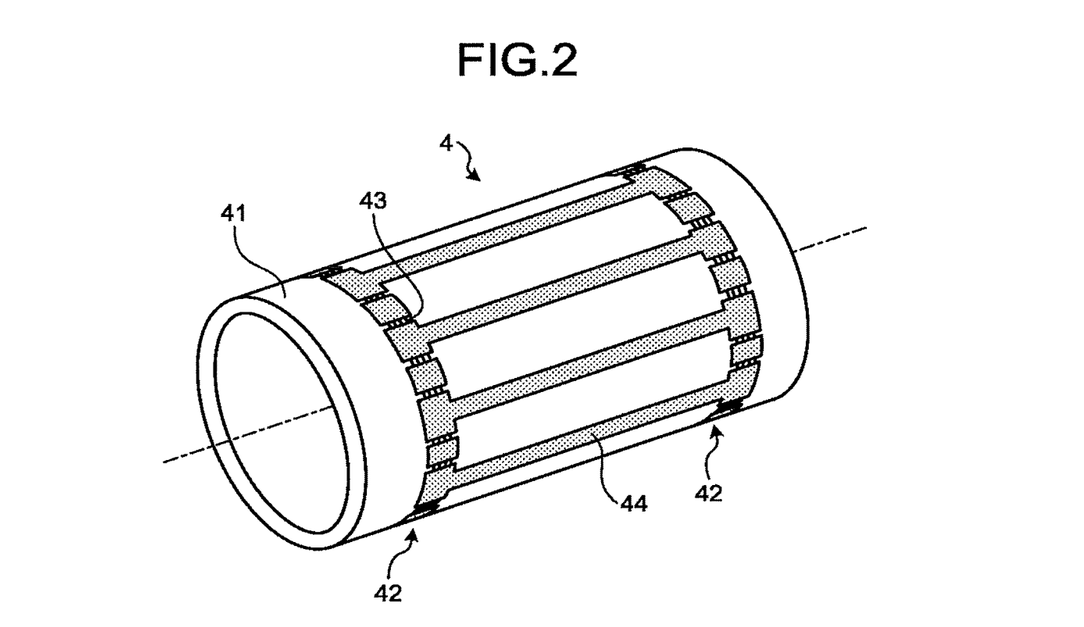
FIG. 2 is a perspective view illustrating a configuration example of a first element unit of a WB coil according to a first embodiment.

FIG. 2 is a perspective view illustrating a configuration example of the first element unit of the WB coil 4 according to the first embodiment.

For example, as illustrated in FIG. 2, the WB coil 4 has a base material 41, two end rings 42, a plurality of capacitors 43, and a plurality of rungs 44.

The base material 41 is a dielectric member (also called bobbin) formed in a cylindrical shape and supports the end rings 42, the rungs 44, the capacitors 43, and the like.

The end rings 42 are each a ring-like conductor disposed along the circumferential direction on the outer peripheral surface of the base material 41 and disposed one on each side in the axial direction of the base material 41. Each end ring 42 is formed of a plurality of conductors disposed side by side along the circumferential direction of the base material 41, and the conductors are connected to each other by the capacitor 43.

The capacitors 43 are each a fixed capacitor having a predetermined capacitance and are disposed at a plurality of positions along the circumferential direction in the end ring 42. The capacitors 43 are disposed on both sides of each of a plurality of connection parts where the end rings 42 are connected with the rungs 44, along the circumferential direction of the end rings 42.

The rungs 44 are each an elongated rectangular conductor disposed along the axial direction on the outer peripheral surface of the base material 41 and are disposed at regular intervals along the circumferential direction of the end rings 42. Specifically, the rungs 44 are provided every other conductors of the end ring 42, along the circumferential direction of the end ring 42. Each rung 44 has one end in the longitudinal direction connected to one of two end rings 42 and has the other end in the longitudinal direction connected to the other end ring 42.

In the present embodiment, each microstrip antenna included in the second element unit is disposed along the rung 44 included in the first element unit and is configured with the rung as a ground conductor.

Figure 3:
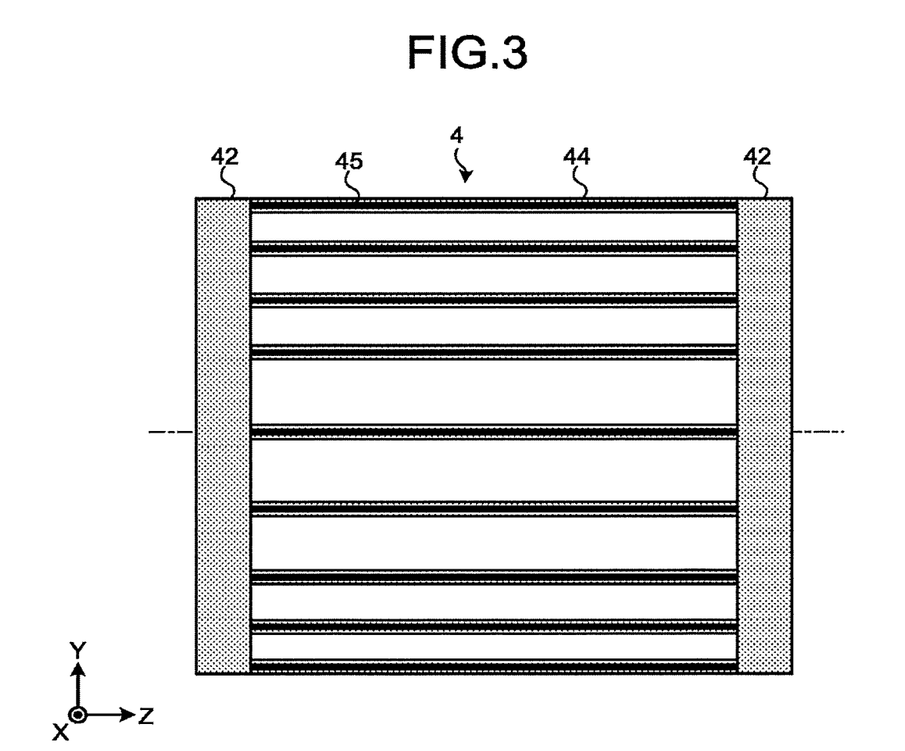
FIG. 3 is a side view illustrating a configuration example of a second element unit of the WB coil according to the first embodiment.

FIG. 3 is a side view illustrating a configuration example of the second element unit of the WB coil 4 according to the first embodiment. In FIG. 3, the base material 41 and the capacitors 43 are not illustrated for convenience of explanation.

For example, as illustrated in FIG. 3, the WB coil 4 has a plurality of antenna conductors 45.

The antenna conductors 45 are each a conductor formed in an elongated flat plate and disposed on the inside of the rung 44 on the inner peripheral surface of the base material 41. Here, the antenna conductor 45 is sized such that the length in the longitudinal direction is approximately equal to the rung 44, and disposed along the rung 44 over the entire rung 44 in the longitudinal direction.

In this way, in the present embodiment, the dielectric base material 41 is disposed between the antenna conductor 45 and the rung 44 so that the rung 44 can be used as the ground conductor of the microstrip antenna.

In the present embodiment, in the WB coil 4, one of the first element unit and the second element unit is used in transmission, and one of the first element unit and the second element unit is used in reception.

For example, in the WB coil 4, the first element unit is used in transmission, and one of the first element unit and the second element unit is used in reception.

Here, in the WB coil 4, when the first element unit is used, the second element unit and the first element unit are short-circuited. Meanwhile, in the WB coil 4, when the second element unit is used, the rung 44 is used as a ground conductor of the microstrip antenna.

Specifically, the WB coil 4 has a transmission/reception switching circuit for switching between a state in transmission and a state in reception.

Figure 4:
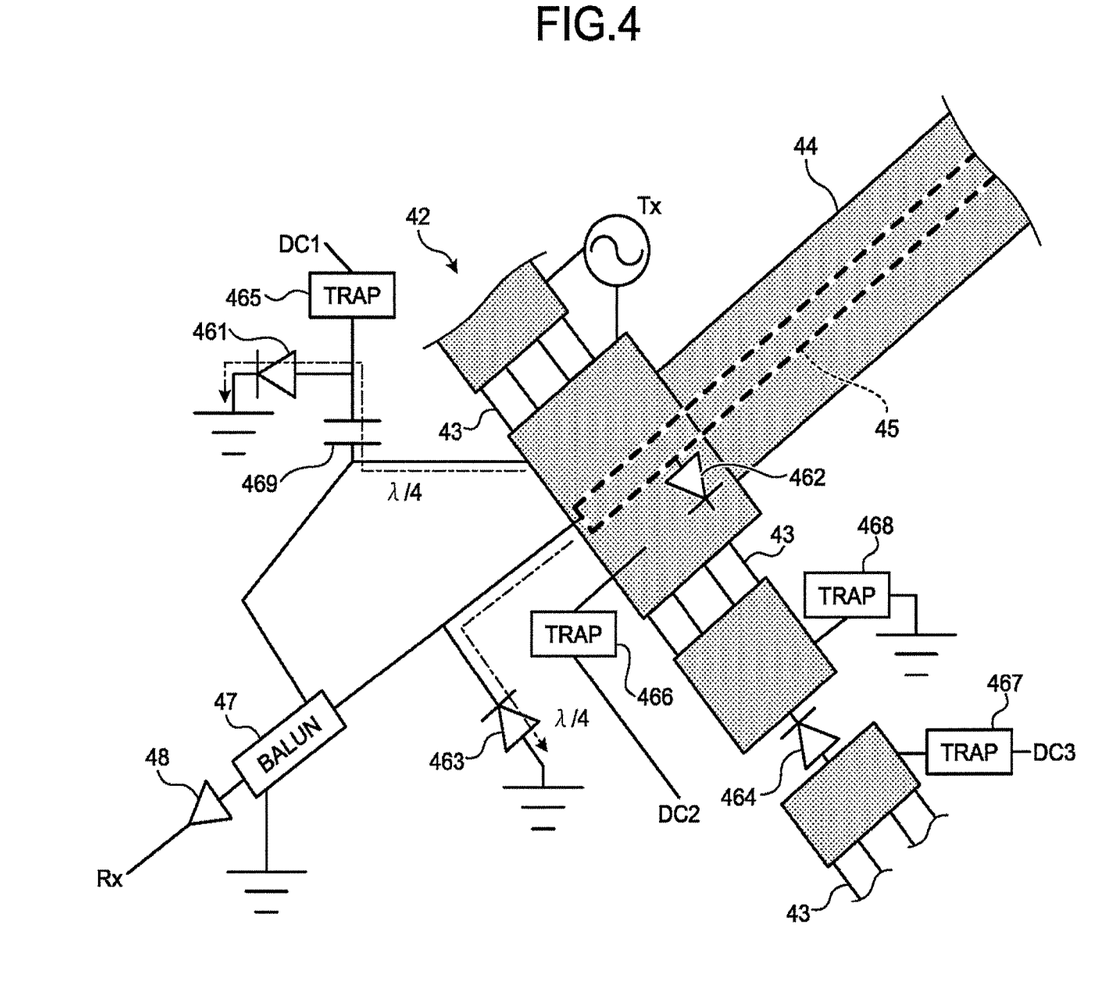
FIG. 4 is a diagram illustrating a configuration example of a transmission/reception switching circuit of the WB coil according to the first embodiment.

FIG. 4 is a diagram illustrating a configuration example of the transmission/reception switching circuit of the WB coil 4 according to the first embodiment. FIG. 4 illustrates one of a plurality of connection parts where the end rings 42 and the rungs 44 are connected. Other connection parts are configured similarly.

For example, as illustrated in FIG. 4, the WB coil 4 includes, as a transmission/reception switching circuit, first to fourth diodes 461 to 464, first to fourth trap circuits 465 to 468, and a capacitor 469 and further includes a balun 47 and an amplifier 48.

Here, the first diode 461 has one end connected to the end ring 42 through the capacitor 469 and in parallel further connected to the processing circuitry 14 through the first trap circuit 465 and has the other end connected to the ground.

The second diode 462 has one end connected to the antenna conductor 45 and has the other end connected to the processing circuitry 14 through the end ring 42 and the second trap circuit 466.

The third diode 463 has one end connected to the ground and has the other end connected to the antenna conductor 45.

The fourth diode 464 is provided on, of a plurality of conductors constituting the end ring 42, a conductor not connected with the rung 44 and extends across a gap that divides the conductor into two in the circumferential direction. The fourth diode 464 has one end connected to the processing circuitry 14 through the third trap circuit 467 and has the other end connected to the ground through the fourth trap circuit 468.

Here, the first to fourth trap circuits 465 to 468 are each a tuned circuit tuned so as to block a high frequency of resonance frequency.

The balun 47 has an input end connected to each of a path connecting the capacitor 469 and the end ring 42 and a path connecting the third diode 463 and the antenna conductor 45 and has an output end connected to the receiver circuitry 7 (Rx) through the amplifier 48. The end ring 42 is connected to the transmitter circuitry 6 (Tx).

Here, a path between the end ring 42 and the ground through the first diode 461 and a path between the antenna conductor 45 and the ground through the third diode 463 are each configured such that an electrical path length is $\lambda/4$, where $\lambda$ is the wavelength of an RF pulse signal supplied from the transmitter circuitry 6.

In the present embodiment, the states of the transmission/reception switching circuit in transmission and in reception are switched when the data acquisition function 141 of the processing circuitry 14 executes a pulse sequence.

Here, an example in which the first element unit is used in transmission and the second coil element is used in reception is described.

For example, when the first element unit is used in transmission, the data acquisition function 141 supplies control current (direct current) DC1 to the first diode 461 through the first trap circuit 465, supplies control current (direct current) DC2 to the second diode 462 and the third diode 463 through the second trap circuit 466, and supplies control current (direct current) DC3 to the fourth diode 464 through the third trap circuit 467 to turn on the diodes.

Here, the fourth diode 464 turns on to allow the end ring 42 and the rung 44 to be electrically connected as a whole. The first diode 461 turns on to allow the end ring 42 to be electrically connected with the ground. The second diode 462 turns on to allow the antenna conductor 45 to be electrically connected with the end ring 42 and the rung 44. The third diode 463 turns on to allow the antenna conductor 45 to be electrically connected with the ground.

Thus, when an RF pulse signal is supplied from the transmitter circuitry 6 to the WB coil 4, current of the RF pulse signal flows through the birdcage coil configured with two end rings 42 and a plurality of rungs 44. In other words, the first element unit applies an RF magnetic field to the imaging space.

In this case, since the path between the end ring 42 and the ground through the first diode 461 and the path between the antenna conductor 45 and the ground through the third diode 463 are each configured such that an electrical path length is λ/4 as previously mentioned, the input end from the end ring 42 and the rung 44 to the receiving system is in the open state. Consequently, neither current of the RF pulse signal flowing through the end ring 42 and the rung 44 nor current of the RF pulse signal flowing through the antenna conductor 45 short-circuited with the end ring 42 and the rung 44 flows through the receiver circuitry 7.

On the other hand, when the second element unit is used in reception, the data acquisition function 141 does not supply control current to the first to fourth diodes 461 to 464 to turn off the diodes.

Here, the fourth diode 464 turns off to allow the rungs 44 to be electrically isolated from each other. The first diode 461 turns off to allow the end ring 42 and the rung 44 to be electrically connected with the receiving system. The second diode 462 turns off to allow the antenna conductor 45 to be electrically isolated from the end ring 42 and the rung 44. The third diode 463 turns off to allow the antenna conductor 45 to be electrically connected with the receiving system.

With this configuration, when an MR signal is produced from the subject S, the rung 44 serves as a ground conductor, and the MR signal is received by the microstrip antenna formed with the antenna conductor 45 and the rung 44, and output to the receiver circuitry 7. In other words, the MR signal is received by the second element unit.

The configuration of the transmission/reception switching circuit provided in the WB coil 4 is not limited to the configuration above and may be implemented using a variety of circuit elements.

In this way, in the present embodiment, when the first element unit is used, the second element unit and the first element unit are short-circuited, thereby eliminating the need for decoupling. On the other hand, when the second element unit is used, the rung 44 is used as the ground conductor of the microstrip antenna, thereby eliminating the need for decoupling.

In the present embodiment, the main control function 161 of the processing circuitry 16 has the function of performing parallel imaging using the sensitivity distribution of each microstrip antenna included in the second element unit. Here, a variety of known methods, for example, sensitivity encoding (SENSE), simultaneous acquisition of spatial harmonics (SMASH), and generalized autocalibrating partially parallel acquisitions (GRAPPA) can be used as parallel imaging performed by the main control function 161.

In the present embodiment, for example, the image generation function 151 of the processing circuitry 15 has the function of performing sensitivity correction of correcting non-uniformity in an image generated based on an MR signal received by each microstrip antenna included in the second element unit, with reference to an image generated based on an MR signal acquired by the first element unit. For example, the image generation function 151 performs, as reference scans, a first scan using the first element unit and a second scan using the second element unit. The image generation function 151 generates a first image based on the MR signal acquired by the first scan, generates a second image based on the MR signal acquired by the second scan, and compares the first and second images to create a sensitivity map. The image generation function 151 then uses the generated sensitivity map to correct non-uniformity in the image generated based on the MR signal acquired by a main scan using the second element unit.

To perform such sensitivity correction of an image, an image used as a reference is required to have uniform sensitivity. In this respect, in the present embodiment, since the first element unit is a birdcage coil, a reference image having uniform sensitivity can be obtained.

In the foregoing example, it is assumed that parallel imaging is performed using the first element unit in transmission and using the second coil element in reception. However, the manner of using the coil elements is not limited thereto. For example, when imaging other than parallel imaging is performed, the first element unit may be used both in transmission and in reception, or the second element unit may be used both in transmission and in reception.

As described above, in the present embodiment, the WB coil 4 has a birdcage coil as the first element unit and additionally has a plurality of microstrip antennas as the second element unit using the rungs 44 of the birdcage coil as ground conductors. In such a configuration, the birdcage coil can be used to produce a uniform RF magnetic field and, in addition, the sensitivity distribution of each microstrip antenna can be used to perform parallel imaging. Therefore, the present embodiment enables parallel imaging while ensuring the uniformity of RF magnetic field without using an array coil.

In the present embodiment, when sensitivity correction of an image is performed, a reference image having uniform sensitivity can be obtained using the first element unit. Therefore, the present embodiment can provide an image with a sufficient SNR in parallel imaging, only with the WB coil 4 without using an array coil.

Although in the foregoing first embodiment, the antenna conductor 45 included in the second element unit is disposed along the rung 44 over the entire rung 44 in the longitudinal direction, embodiments are not limited thereto.

For example, in the configuration above, in the second element unit, when the direction along the magnetic flux of a static magnetic field is the Z-direction, the horizontal direction orthogonal to the Z-direction is the X-direction, and the vertical direction orthogonal to each of the Z-direction and the X-direction is the Y-direction, the sensitivity distribution in a plane along the X-direction and the Y-direction is the same at each position in the Z-direction. That is, with the configuration above, parallel imaging can be performed using the sensitivity distribution in a plane along the X-direction and the Y-direction.

By contrast, for example, the second element unit may be configured such that a plurality of microstrip antennas are disposed such that the sensitivity distribution in a plane along the X-direction and the Y-direction varies according to the position in the Z-direction. With this configuration, parallel imaging can be performed using the sensitivity distribution in a plane along the X-direction and the Y-direction and additionally using the sensitivity distribution along the Z-direction.

In the following, other embodiments for the WB coil in such a case will be described. In the embodiments described below, differences from the first embodiment are mainly described and a description common to the first embodiment is omitted.

Second Embodiment

For example, in the WB coil, the second element unit may include a plurality of microstrip antennas each having a length shorter in the Z-direction than the first element unit and disposed at different positions in a first direction.

Figure 5:
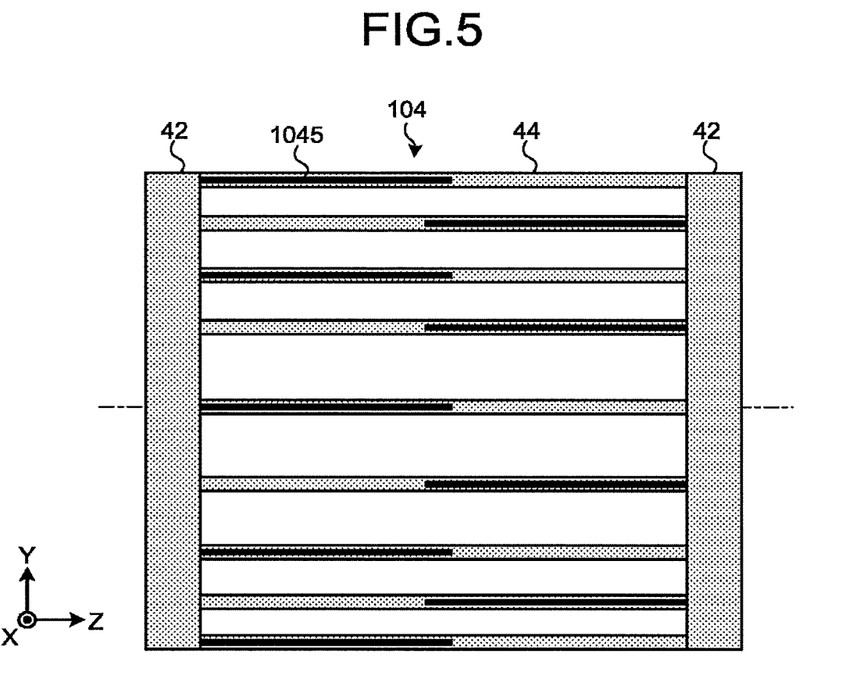
FIG. 5 is a side view illustrating a configuration example of the WB coil according to a second embodiment.

FIG. 5 is a side view illustrating a configuration example of a WB coil 104 according to a second embodiment. In FIG.

5, the base material 41 and the capacitors 43 are not illustrated for convenience of explanation.

For example, as illustrated in FIG. 5, in the present embodiment, antenna conductors 1045 are each formed such that the length in the Z-direction is shorter than the rung 44. In the present embodiment, the antenna conductors 1045 are each disposed on one side of both ends in the Z-direction of the rungs 44 on the inner peripheral surface of the base material 41, and their positions in the Z-direction change alternately one by one along the circumferential direction of the WB coil 104.

The positions of the antenna conductors 1045 in the Z-direction may not change alternately one by one along the circumferential direction of the WB coil 104. Alternatively, the positions may change every predetermined number, for example, every two or three.

In the present embodiment, each antenna conductor 1045 is formed so as to be longer than half the length of the rung 44. Thus, in the present embodiment, all of the antenna conductors 1045 are disposed in a plane along the X-direction and the Y-direction in the vicinity of the center in the axial direction of the WB coil 104.

With such a configuration, in the second element unit, the sensitivity distribution in a plane along the X-direction and the Y-direction varies between the vicinity of the center in the Z-direction, a range closer to one side of both ends in the Z-direction, and a range close to the other side of both ends in the Z-direction.

Third Embodiment

For example, in the WB coil, the second element unit may include a plurality of microstrip antennas having different lengths in the Z-direction.

Figure 6:
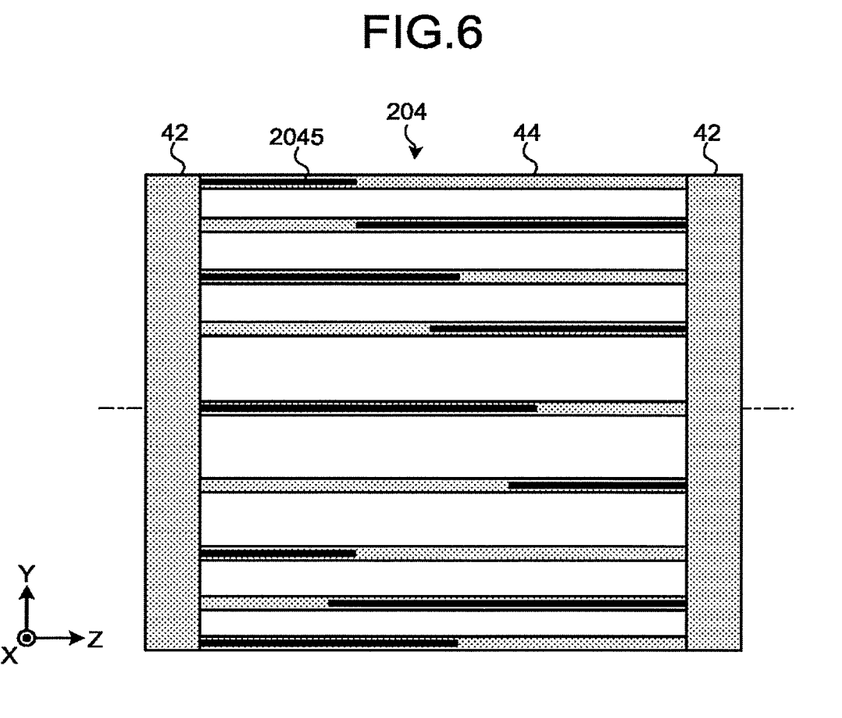
FIG. 6 is a side view illustrating a configuration example of the WB coil according to a third embodiment.

FIG. 6 is a side view illustrating a configuration example of a WB coil 204 according to a third embodiment. In FIG. 6, the base material 41 and the capacitors 43 are not illustrated for convenience of explanation.

For example, as illustrated in FIG. 6, in the present embodiment, antenna conductors 2045 are each formed such that the length in the Z-direction is shorter than the rung 44 and are formed with individually different lengths. Also in the present embodiment, the antenna conductors 2045 are each disposed on one side of both ends in the Z-direction of the rung 44 on the inner peripheral surface of the base material 41 and are disposed such that their positions in the Z-direction change alternately one by one along the circumferential direction of the WB coil 104.

Also in the present embodiment, the positions in the Z-direction of the antenna conductors 1045 may change every predetermined number, for example, every two or three, rather than changing alternately one by one along the circumferential direction of the WB coil 104.

With such a configuration, in the second element unit, the sensitivity distribution in a plane along the X-direction and the Y-direction varies for each position in the Z-direction.

Fourth Embodiment

For example, in the WB coil, the rungs 44 included in the first element unit may be disposed diagonally to the Z-direction.

Figure 7:
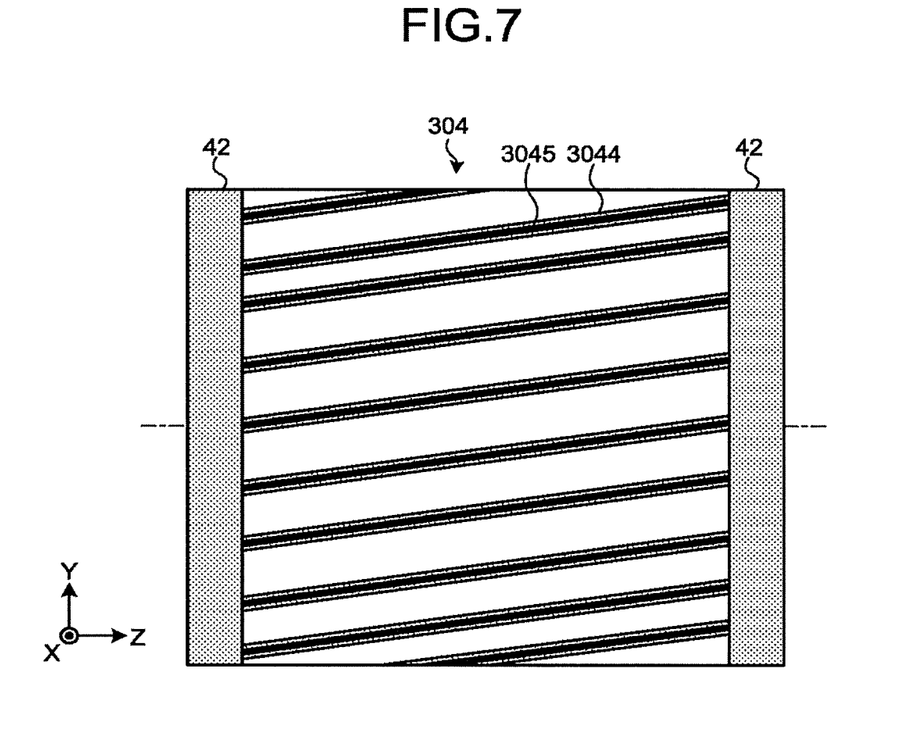
FIG. 7 is a side view illustrating a configuration example of the WB coil according to a fourth embodiment.

FIG. 7 is a side view illustrating a configuration example of a WB coil 304 according to a fourth embodiment. In FIG. 7, the base material 41 and the capacitors 43 are not illustrated for convenience of explanation.

For example, as illustrated in FIG. 7, in the present embodiment, rungs 3044 are each disposed diagonally to the Z-direction. More specifically, each rung 3044 is disposed diagonally to the circumferential direction of two end rings 42 along the outer peripheral surface of the base material 41. In the present embodiment, antenna conductors 3045 are each disposed along the rung 3044 over the entire rung 3044 in the longitudinal direction.

With such a configuration, in the second element unit, the sensitivity distribution in a plane along the X-direction and the Y-direction changes so as to rotate in the circumferential direction of the WB coil 304 as the position in the Z-direction is shifted.

In the foregoing second and third embodiments, in each microstrip antenna included in the second element unit, the length in the Z-direction of the antenna conductor is determined based on at least one of the distance between the antenna conductor and the rung, the material of dielectric of the base material 41, and the width of the antenna conductor.

According to the foregoing second to fourth embodiments, in the second element unit, a plurality of microstrip antennas are disposed such that the sensitivity distribution in a plane along the X-direction and the Y-direction varies according to the position in the Z-direction, whereby parallel imaging can be performed using the sensitivity distribution in a plane along the X-direction and the Y-direction and additionally using the sensitivity distribution along the Z-direction.

Although in the foregoing first to fourth embodiments, each microstrip antenna is configured such that the dielectric base material 41 is disposed between the antenna conductor and the rung, embodiments are not limited thereto. For example, each microstrip antenna may be configured such that a dielectric different from the base material 41 is disposed between the antenna conductor and the rung, and each microstrip may be disposed on the outer peripheral surface of the base material 41.

Fifth Embodiment

The MRI apparatus 100 according to the first to fourth embodiments has been described above. As previously mentioned, the MRI apparatus 100 according to the embodiments can perform parallel imaging while ensuring the uniformity of RF magnetic field, with the configuration described above without using an array coil. As a fifth embodiment, parallel imaging performed by the MRI apparatus 100 according to the embodiments above will be described in detail below.

Specifically, as described in the embodiments, the MRI apparatus 100 includes the whole body RF coil 4 accommodated in a gantry and including a first element unit used for transmission of an RF magnetic field and a second element unit used for reception of an MR signal produced from a subject having been applied with the RF magnetic field. Here, the first element unit is a birdcage-type RF coil including two end rings and a plurality of rungs spaced apart from each other along the circumferential direction of the end rings. The second element unit is a microstrip antenna.

When parallel imaging is performed, the data acquisition function 141 of the processing circuitry 14 transmits an RF magnetic field using the first element unit, based on a pulse sequence for parallel imaging, and receives an MR signal produced from a subject having been applied with the RF magnetic field, using the second element unit, to acquire first k-space data thinned in the phase encode direction for each microstrip antenna. Subsequently, the image generation function 151 of the processing circuitry 15 generates an image by unfolding aliasing in the first k-space data using the sensitivity difference between the microstrip antennas.

Figure 8:
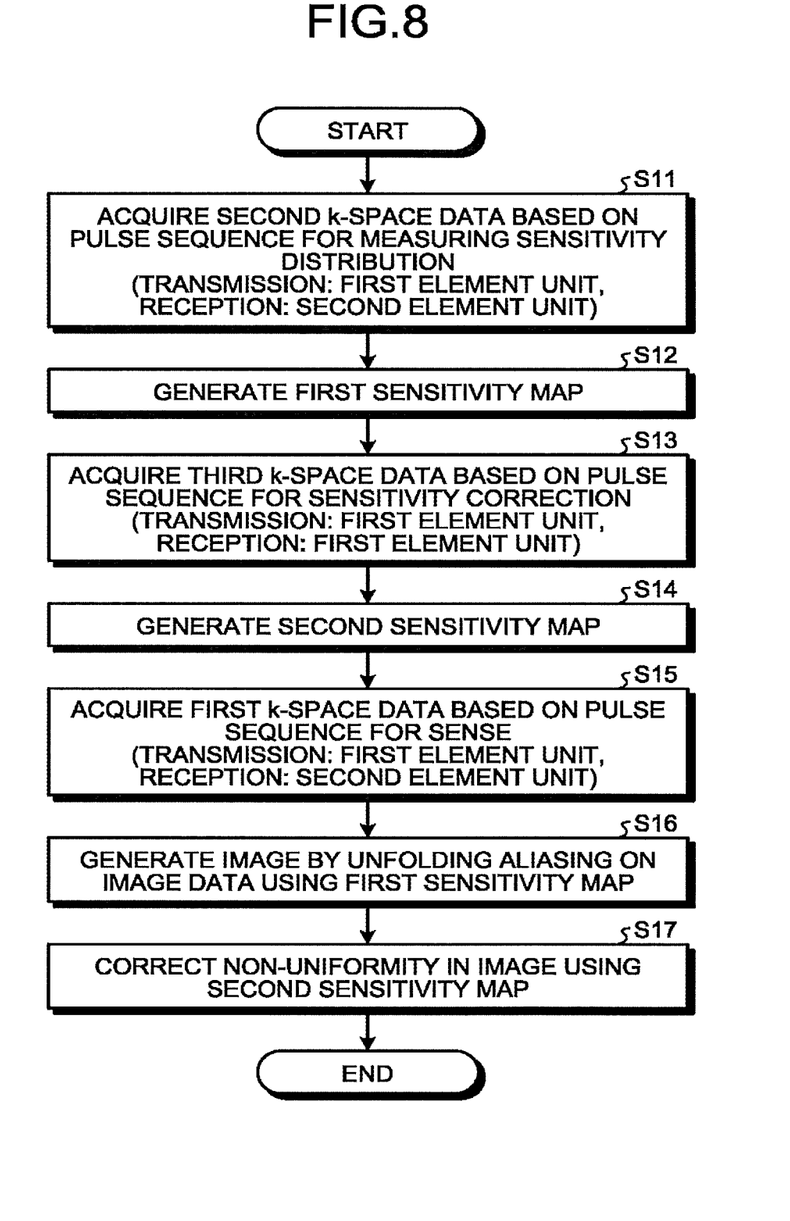
FIG. 8 is a flowchart illustrating an example of parallel imaging performed by the MRI apparatus according to a fifth embodiment.

FIG. 8 is a flowchart illustrating an example of parallel imaging performed by the MRI apparatus 100 according to the fifth embodiment. Here, SENSE is performed as an example of parallel imaging.

For example, as illustrated in FIG. 8, first of all, the data acquisition function 141 transmits an RF magnetic field using the first element unit, based on a preset pulse sequence for measuring sensitivity distribution, and receives an MR signal produced from the subject having been applied with the RF magnetic field, using the second element unit, to acquire second k-space data for each microstrip antenna (step S11).

Subsequently, the image generation function 151 generates a first sensitivity map indicating the sensitivity distribution of the microstrip antenna, for each microstrip antenna, based on the acquired second k-space data (step S12).

Subsequently, the data acquisition function 141 transmits an RF magnetic field using the first element unit, based on a preset pulse sequence for sensitivity correction (also called brightness correction), and receives an MR signal produced from the subject having been applied with the RF magnetic field, using the first element unit to acquire third k-space data (step S13).

Subsequently, the image generation function 151 generates a second sensitivity map indicating the sensitivity distribution of the first element unit, based on the acquired third k-space data (step S14).

Subsequently, the data acquisition function 141 transmits an RF magnetic field using the first element unit, based on a preset pulse sequence for SENSE, and receives an MR signal produced from the subject having been applied with the RF magnetic field, using the second element unit, to acquire first k-space data thinned in the phase encode direction for each microstrip antenna (step S15).

Subsequently, the image generation function 151 generates an image by unfolding aliasing on the image data generated from the first k-space data, using the first sensitivity map for each microstrip antenna (step S16). Here, the image generation function 151 generates an image by unfolding aliasing on the image data by the same method as performed in conventional SENSE.

Further, the image generation function 151 performs sensitivity correction of correcting non-uniformity in the generated image, using the second sensitivity map (step S17). For example, the image generation function 151 corrects non-uniformity in the image by comparing the second sensitivity map obtained using the first element unit with the first sensitivity map obtained for each microstrip, pixel by pixel, and correcting the signal value of each pixel in accordance with the ratio.

Here, in the process above, the processing at steps S11, S13, and S15 is implemented, for example, by the processing circuitry 14 reading a predetermined program corresponding to the data acquisition function 141 from the storage 12 and executing the program. The processing at steps S12, S14, S16, and S17 is implemented, for example, by the processing circuitry 15 reading a predetermined program corresponding to the image generation function 151 from the storage 12 and executing the program.

When sensitivity correction of an image is unnecessary, the processing at step S13 (data acquisition for sensitivity correction, S14 (generation of a sensitivity map for sensitivity correction), and S17 (sensitivity correction of an image) does not have to be performed.

The processing at steps S11 to S14 does not necessarily have to be performed in the order above. For example, after the processing at steps S13 and S14 (data acquisition for sensitivity correction and generation of a sensitivity map) is performed, the processing at steps S11 and S12 (data acquisition for measuring sensitivity distribution and generation of a sensitivity map) may be performed. Alternatively, for example, after the processing at steps S11 and S13 (data acquisition for measuring sensitivity distribution and for sensitivity correction) is performed, the processing at steps S12 and S14 (generation of a sensitivity map for measuring sensitivity distribution and for sensitivity correction) may be performed.

Figure 9:
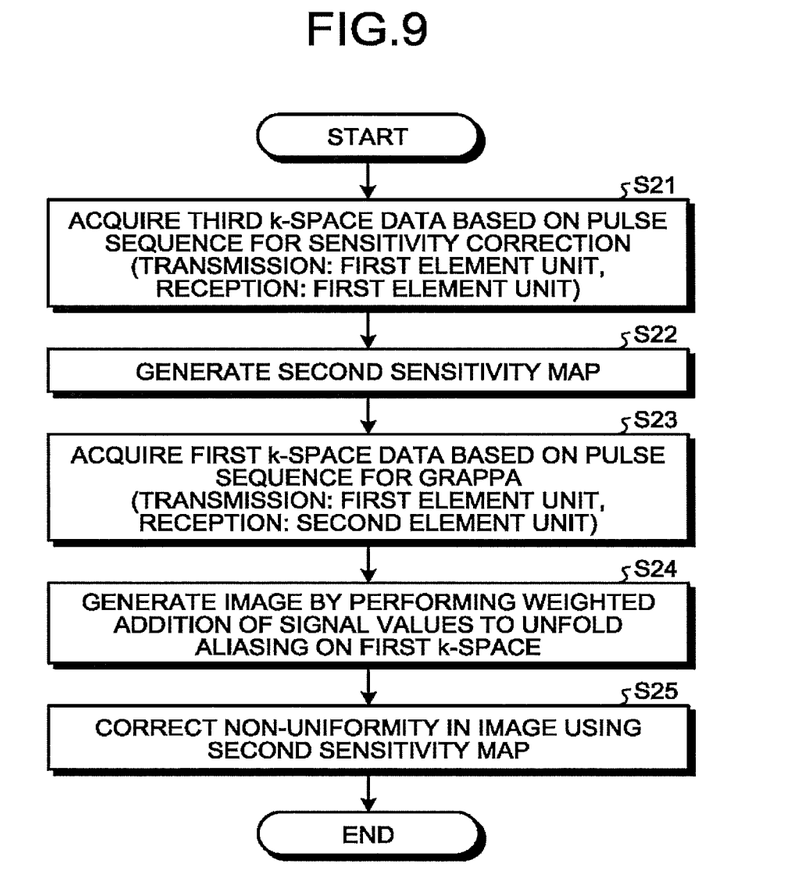
FIG. 9 is a flowchart illustrating another example of parallel imaging performed by the MRI apparatus according to the fifth embodiment.

FIG. 9 is a flowchart illustrating another example of parallel imaging performed by the MRI apparatus 100 according to the fifth embodiment. Here, GRAPPA is performed as another example of parallel imaging.

For example, as illustrated in FIG. 9, first of all, the data acquisition function 141 transmits an RF magnetic field using the first element unit, based on a preset pulse sequence for sensitivity correction (also called brightness correction), and receives an MR signal produced from the subject having been applied with the RF magnetic field, using the first element unit, to acquire third k-space data (step S21).

Subsequently, the image generation function 151 generates a second sensitivity map indicating the sensitivity distribution of the first element unit, based on the acquired third k-space data (step S22).

Subsequently, the data acquisition function 141 transmits an RF magnetic field using the first element unit, based on a preset pulse sequence for GRAPPA, and receives an MR signal produced from the subject having been applied with the RF magnetic field, using the second element unit, to acquire first k-space data thinned in the phase encode direction, for each microstrip antenna (step S23). Here, the data acquisition function 141 acquires first k-space data so as to include data at the center part of the k-space, for each microstrip antenna.

Subsequently, the image generation function 151 generates an image by performing weighted addition of signal values among the first k-space data acquired for each microstrip antenna to unfold aliasing on the first k-space data (step S24). Here, the image generation function 151 generates an image by unfolding aliasing on the first k-space data by the same method as performed in conventional GRAPPA.

Further, the image generation function 151 performs sensitivity correction of correcting non-uniformity in the generated image, using the second sensitivity map (step S25). For example, the image generation function 151 corrects non-uniformity in the image by comparing the second sensitivity map obtained using the first element unit with the image generated from the first k-space data by unfolding aliasing for each microstrip, pixel by pixel, and correcting the signal value of each pixel in accordance with the ratio.

In the process above, the processing at steps S21 and S23 is implemented, for example, by the processing circuitry 14 reading a predetermined program corresponding to the data acquisition function 141 from the storage 12 and executing the program. The processing at steps S22, S24, and S25 is implemented, for example, by the processing circuitry 15 reading a predetermined program corresponding to the image generation function 151 from the storage 12 and executing the program.

When sensitivity correction of an image is unnecessary, the processing at steps S13, S14, and S17 does not have to be performed.

Although SENSE and GRAPPA are performed in the examples described above, embodiments are not limited thereto. The MRI apparatus 100 according to the embodiments can perform other kinds of parallel imaging using the first element unit and the second element unit included in the WB coil 4 in the same manner.

As described above, when parallel imaging is performed, the MRI apparatus 100 according to the present embodiment uses the first element unit that is a birdcage-type RF coil for transmission of an RF magnetic field and uses the second element unit including a plurality of microstrip antennas for reception of an MR signal. Thus, in the present embodiment, a uniform RF magnetic field can be produced, and parallel imaging can be performed using the sensitivity difference between microstrip antennas. The present embodiment therefore enables parallel imaging while ensuring the uniformity of RF magnetic field without using an array coil.

When sensitivity correction of an image is performed, the MRI apparatus 100 according to the present embodiment uses the first element unit that is a birdcage-type RF coil for transmission of an RF magnetic field and reception of an MR signal to acquire a sensitivity map (second sensitivity map) for sensitivity correction. The present embodiment thus can perform sensitivity correction of an image with reference to a sensitivity map having uniform sensitivity and can provide an image with a favorable SNR.

The word "processor" used in the description above means, for example, a central processing unit (CPU), a graphics processing unit (GPU), or circuitry such as an application specific integrated circuit (ASIC), a programmable logic device (for example, a simple programmable logic device (SPLD), a complex programmable logic device (CPLD), and a field programmable gate array (FPGA)). A program may be directly embedded in a circuit of a processor, rather than storing a program in a storage. In this case, the processor implements a function by reading and executing a program embedded in a circuit. Each processor in the present embodiment is not limited to a configuration as a single circuit for each processor, and a plurality of independent circuits may be combined as one processor to implement the function. Furthermore, a plurality of components in FIG. 1 may be integrated into one processor to implement the function.

Here, a program executed by a processor is embedded in advance in, for example, a read only memory (ROM) or a storage. This program may be recorded on a computer-readable recording medium such as a compact disc (CD)-ROM, a flexible disk (FD), a CD-R (recordable), and digital versatile disc (DVD), in a format installable or executable in such devices. This program may be stored on a computer connected to a network such as the Internet and downloaded via the network to be provided or distributed. For example, this program is configured with modules including the functional units described above. As actual hardware, a CPU reads the program from a recording medium such as ROM and executes the program whereby the modules are loaded onto a main storage device and generated on the main storage device.

According to at least one embodiment described above, parallel imaging can be performed while ensuring the uniformity of RF magnetic field without using an array coil.

While certain embodiments have been described, these embodiments have been presented by way of example only, and are not intended to limit the scope of the. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus, comprising a whole body RF coil accommodated in a gantry, the whole body RF coil including:
   a first element unit used for transmission of a radio frequency magnetic field; and
   a second element unit used for reception of a magnetic resonance signal produced from a subject having been applied with the radio frequency magnetic field, wherein
   the first element unit is a birdcage-type RF coil including a base material of a dielectric formed in a cylindrical shape, two end rings and a plurality of rungs spaced apart from each other along a circumferential direction of the end rings, each of the plurality of rungs being an elongated rectangular conductor disposed along an axial direction on an outer peripheral surface of the base material, the plurality of rungs including a first rung and a second rung, and
   the second element unit includes a first microstrip antenna and a second microstrip antenna including an antenna conductor and a ground conductor, the antenna conductors of the first microstrip antenna and the second microstrip antenna being respectively disposed on insides of the first rung and the second rung on an inner peripheral surface of the base material and being disposed at different positions in a first direction along a magnetic flux of a static magnetic field, the first rung and the second rung respectively serving as the ground conductors of the first microstrip antenna and the second microstrip antenna.

2. The magnetic resonance imaging apparatus according to claim 1, wherein the second element unit is configured such that the antenna conductors of the first microstrip antenna and the second microstrip antenna are disposed such that sensitivity distribution in a plane along a second direction and a third direction varies according to a position in a first direction, wherein the second direction is a direction orthogonal to the first direction, and the third direction is a direction orthogonal to each of the first direction and the second direction.

3. The magnetic resonance imaging apparatus according to claim 1, wherein the antenna conductors of the first microstrip antenna and the second microstrip antenna are respectively disposed along the first rung and the second rung.

4. The magnetic resonance imaging apparatus according to claim 1, wherein the first element unit is further used for reception of the magnetic resonance signal produced from a subject having been applied with the radio frequency magnetic field.

5. The magnetic resonance imaging apparatus according to claim 1, wherein the second element unit is further used for transmission of the radio frequency magnetic field.

6. The magnetic resonance imaging apparatus according to claim 1, wherein in the whole body RF coil, when the first element unit is used, the first rung and the second rung are respectively short-circuited to the antenna conductors of the first microstrip antenna and the second microstrip antenna included in the second element unit.

7. The magnetic resonance imaging apparatus according to claim 2, wherein
    each of the plurality of rungs is disposed diagonally to the first direction, and
    the antenna conductors of the first microstrip antenna and the second microstrip antenna included in the second element unit are respectively disposed along the first rung and the second rung.

8. The magnetic resonance imaging apparatus according to claim 2, further comprising a control unit configured to perform parallel imaging using sensitivity distribution of each of the first microstrip antenna and the second microstrip antenna included in the second element unit.

9. The magnetic resonance imaging apparatus according to claim 8, wherein the control unit performs the parallel imaging using sensitivity distribution along the first direction of each of the first microstrip antenna and the second microstrip antenna.

10. A magnetic resonance imaging apparatus, comprising a whole body RF coil accommodated in a gantry, the whole body RF coil including:
    a first element unit used for transmission of a radio frequency magnetic field; and
    a second element unit used for reception of a magnetic resonance signal produced from a subject having been applied with the radio frequency magnetic field, wherein
    the first element unit is a birdcage-type RF coil including a base material of a dielectric formed in a cylindrical shape, two end rings and a plurality of rungs spaced apart from each other along a circumferential direction of the end rings, each of the plurality of rungs being an elongated rectangular conductor disposed along an axial direction on an outer peripheral surface of the base material, and
    the second element unit includes a microstrip antenna including an antenna conductor and a ground conductor, the antenna conductor being disposed on an inside of one of the plurality of rungs on an inner peripheral surface of the base material, the one of the plurality of rungs serving as the ground conductor of the microstrip antenna, wherein
    the second element unit is configured such that a plurality of the microstrip antennas are disposed such that sensitivity distribution in a plane along a second direction and a third direction varies according to a position in a first direction, wherein the first direction is a direction along a magnetic flux of a static magnetic field, the second direction is a direction orthogonal to the first direction, and the third direction is a direction orthogonal to each of the first direction and the second direction, and
    the antenna conductors of the plurality of the microstrip antennas included in the second element unit each has a length shorter than the plurality of the rungs in the first direction and are disposed at different positions in the first direction.

11. The magnetic resonance imaging apparatus according to claim 10, wherein each microstrip antenna included in the second element unit includes the dielectric disposed between the antenna conductor and the ground conductor, and a length in the first direction of the antenna conductor is determined based on at least one of a distance between the antenna conductor and the ground conductor, a material of the dielectric, and a width of the antenna conductor.

12. A magnetic resonance imaging apparatus, comprising a whole body RF coil accommodated in a gantry, the whole body RF coil including:
    a first element unit used for transmission of a radio frequency magnetic field; and
    a second element unit used for reception of a magnetic resonance signal produced from a subject having been applied with the radio frequency magnetic field, wherein
    the first element unit is a birdcage-type RF coil including a base material of a dielectric formed in a cylindrical shape, two end rings and a plurality of rungs spaced apart from each other along a circumferential direction of the end rings, each of the plurality of rungs being an elongated rectangular conductor disposed along an axial direction on an outer peripheral surface of the base material, and
    the second element unit includes a microstrip antenna including an antenna conductor and a ground conductor, the antenna conductor being disposed on an inside of one of the plurality of rungs on an inner peripheral surface of the base material, the one of the plurality of rungs serving as the ground conductor of the microstrip antenna, wherein
    the second element unit is configured such that a plurality of the microstrip antennas are disposed such that sensitivity distribution in a plane along a second direction and a third direction varies according to a position in a first direction, wherein the first direction is a direction along a magnetic flux of a static magnetic field, the second direction is a direction orthogonal to the first direction, and the third direction is a direction orthogonal to each of the first direction and the second direction, and
    the plurality of the microstrip antennas included in the second element unit have different lengths in the first direction.

13. The magnetic resonance imaging apparatus according to claim 12, wherein each microstrip antenna included in the second element unit includes the dielectric disposed between the antenna conductor and the ground conductor, and a length in the first direction of the antenna conductor is determined based on at least one of a distance between the antenna conductor and the ground conductor, a material of the dielectric, and a width of the antenna conductor.

14. An RF coil, comprising:
    a first element unit used for transmission of a radio frequency magnetic field; and
    a second element unit used for reception of a magnetic resonance signal produced from a subject having been applied with the radio frequency magnetic field, wherein
    the first element unit is a birdcage-type RF coil including a base material of a dielectric formed in a cylindrical shape, two end rings and a plurality of rungs spaced apart from each other along a circumferential direction of the end rings, each of the plurality of rungs being an elongated rectangular conductor disposed along an axial direction on an outer peripheral surface of the base material, the plurality of rungs including a first rung and a second rung, and
    the second element unit includes a first microstrip antenna and a second microstrip antenna each including an antenna conductor and a ground conductor, the antenna conductors of the first microstrip antenna and the second microstrip antenna being respectively disposed on insides of the first rung and the second rung on an inner peripheral surface of the base material and being disposed at different positions in a first direction along a magnetic flux of a static magnetic field, the first rung and the second rung respectively serving as the ground conductors of the first microstrip antenna and the second microstrip antenna.

15. A magnetic resonance imaging method performed by a magnetic resonance imaging apparatus including a whole body RF coil accommodated in a gantry, the whole body RF coil including a first element unit and a second element unit, the first element unit being a birdcage-type RF coil including a base material of a dielectric formed in a cylindrical shape, two end rings and a plurality of rungs spaced apart from each other along a circumferential direction of the end rings, each of the plurality of rungs being an elongated rectangular conductor disposed along an axial direction on an outer peripheral surface of the base material, the plurality of rungs including a first rung and a second rung, the second element unit including a first microstrip antenna and a second microstrip antenna each including an antenna conductor and a ground conductor, the antenna conductors of the first microstrip antenna and the second microstrip antenna being respectively disposed on insides of the first rung and the second rung on an inner peripheral surface of the base material and being disposed at different positions in a first direction along a magnetic flux of a static magnetic field, the first rung and the second rung respectively serving as the ground conductors of the first microstrip antenna and the second microstrip antenna, the magnetic resonance imaging method comprising:

acquiring first k-space data thinned in a phase encode direction for each of the first microstrip antenna and the second microstrip antenna by transmitting a radio frequency magnetic field using the first element unit and receiving a magnetic resonance signal using the second element unit, based on a pulse sequence for parallel imaging, the magnetic resonance signal being produced from a subject having been applied with the radio frequency magnetic field; and generating an image by unfolding aliasing in the first k-space data using a sensitivity difference between the first microstrip antenna and the second microstrip antenna.

16. The magnetic resonance imaging method according to claim 15, further comprising:

acquiring second k-space data for each of the first microstrip antenna and the second microstrip antenna by transmitting a radio frequency magnetic field using the first element unit and receiving a magnetic resonance signal using the second element unit, based on a pulse sequence for measuring sensitivity distribution, the magnetic resonance signal being produced from a subject having been applied with the radio frequency magnetic field; and generating a first sensitivity map indicating sensitivity distribution of the microstrip antenna, for each of the first microstrip antenna and the second microstrip antenna, based on the second k-space data, wherein the image is generated by unfolding aliasing on image data generated from the first k-space data, using the first sensitivity map, for each of the first microstrip antenna and the second microstrip antenna.

17. The magnetic resonance imaging method according to claim 15, wherein the first k-space data is acquired so as to include data at a center part of k-space, for each of the first microstrip antenna and the second microstrip antenna, and the image is generated by performing weighted addition of signal values among the first k-space data acquired for each of the first microstrip antenna and the second microstrip antenna to unfold aliasing on the first k-space data.

18. The magnetic resonance imaging method according to claim 15, further comprising:

acquiring third k-space data by transmitting a radio frequency magnetic field using the first element unit and receiving a magnetic resonance signal using the first element unit, based on a pulse sequence for sensitivity correction, the magnetic resonance signal being produced from a subject having been applied with the radio frequency magnetic field;

generating a second sensitivity map indicating sensitivity distribution of the first element unit, based on the third k-space data; and performing sensitivity correction of correcting non-uniformity in the image, using the second sensitivity map.

* * * * *